April 17, 1956 G. B. HERZOG 2,742,571

JUNCTION TRANSISTOR OSCILLATOR CIRCUIT

Filed Dec. 31, 1953

INVENTOR.

Gerald B. Herzog

BY H. O. Newton

ATTORNEY 2,742,571

JUNCTION TRANSISTOR OSCILLATOR CIRCUIT

Gerald B. Herzog, Princeton, N. J., assignor to Radio Corporation of America, a corporation of Delaware Application December 31, 1953, Serial No. 401,668

11 Claims. (Cl. 250—36)

This invention relates to electrical signal generators or oscillator circuits and in particular to such circuits utilizing semi-conductor devices of the junction type.

The recent development of commercially useful semi-conductor devices of the type employing a semi-conductive element having three contacting electrodes has already had a decided effect upon, and has caused the introduction of many new techniques in the electric signal communication field. These devices, known extensively as "transistors," are small in size especially when compared with the ordinary vacuum tube, require no heater power, are very durable and consist of materials which appear to have a long useful life. Therefore, the use of transistors for oscillator as well as other circuit applications has been the subject of extensive investigation.

Transistors, as is well known, are of two general classes which are known as the point-contact transistor and the junction transistor. Each of these classes is known to exhibit different characteristics which have made one class preferable to the other for certain circuit applications.

The current gain of junction transistors, as defined by the ratio of collector electrode current to emitter electrode current, is less than unity. This characteristic of the junction type transistor has apparently made its application to oscillator circuits less convenient than the point-contact type. Point-contact transistors, as is well known in the art, may be current multiplication devices and may, under certain conditions, exhibit a negative resistance. Thus, oscillators have been designed using point-contact transistors which do not require an external feedback path. Heretofore, however, it has been generally considered necessary to provide an external feedback path to sustain oscillations in those circuits utilizing junction transistors.

Recent developments have indicated that junction transistors are generally to be preferred in radio signal communication systems of all types. Thus, in some superheterodyne receiving systems the various amplifying and signal detection stages may all use junction type transistors. Because of the simplicity of known point-contact transistor oscillator circuits, however, the receiver may utilize oscillator circuits of this latter type. It is obvious, of course, that the exclusive use of one type of transistor in a receiver, whether it be of the point-contact or junction type, is a decided advantage. Obviously, such a receiver simplifies repair procedures when transistors need replacing. In addition, it permits the various transistor units to be normally interchangeable.

In addition to these advantages that might be realized from the exclusive use of junction type transistors in a receiver, the relative stability of the characteristics of the junction transistors themselves recommends them for radio frequency circuit applications. It has been found, for example, that due to the stability of the characteristics of junction transistors, their performance may be predicted with relative accuracy in various circuit applications.

It is, accordingly, an object of the present invention to provide an improved and simplified oscillator circuit which utilizes a semi-conductor device having a current gain less than unity.

It is a further object of the present invention to provide an improved low cost electrical signal generator circuit utilizing a junction transistor as the signal amplifying element.

It is still another object of the present invention to provide a semi-conductor oscillator circuit utilizing a transistor of the junction type wherein external feedback means may be eliminated.

It is yet another object of the present invention to provide an improved oscillator circuit which utilizes a negative resistance characteristic of a junction transistor to establish and maintain stabilized oscillations.

These and further objects and advantages of the present invention are achieved by the discovery, in accordance with the invention, that junction transistors may exhibit a negative resistance characteristic over a portion of their operating region if properly biased. This negative resistance characteristic of the junction transistor is used in accordance with the invention to sustain oscillations in a parallel resonant tuned circuit. Thus, a junction transistor oscillator is possible without the provision of external feedback.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
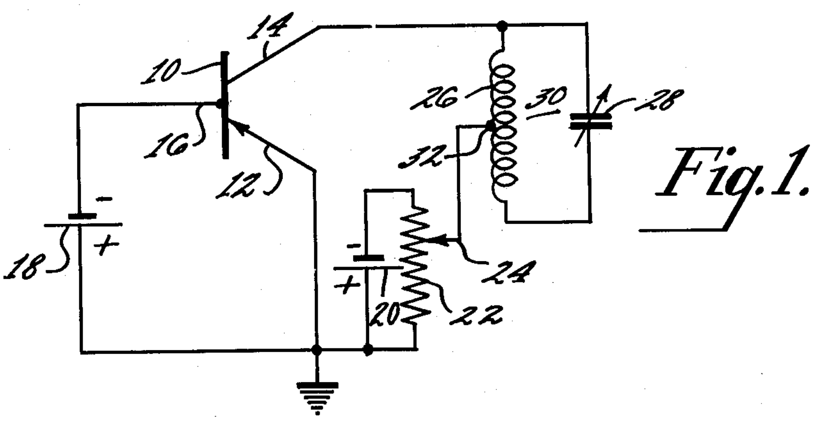
Figure 1 is a schematic circuit diagram of a transistor oscillator circuit utilizing a P–N–P junction transistor connected in accordance with the present invention.

Referring now to the drawing, wherein like elements are designated by like reference numerals throughout the figures, and referring particularly to Figure 1, a junction transistor 8 of the P–N–P type includes a semi-conductive body 10 and three contacting electrodes which have been designated as an emitter 12, a collector 14 and a base 16. To provide proper biasing potentials for oscillator operation, in accordance with the invention, the negative terminal of a battery 18 is connected directly with the base 16 for applying a fixed bias voltage thereto. The positive terminal of the battery 18 is returned to a source of fixed reference potential or ground for the system as shown. While a P–N–P transistor has been used to illustrate the invention, N–P–N junction transistors may be used by reversing the polarity of the biasing source.

To provide a variable or adjustable biasing voltage source for the collector 14, a battery 20 has its negative terminal connected through a potentiometer comprising a voltage dividing resistor 22 and an adjustable tap 24. The tap 24 is connected to a tap 32 on an inductor 26, which in combination with a capacitor 28 forms a parallel resonant or tunable tank circuit 30 for the oscillator. The capacitor 28 is variable, for tuning the tank circuit 30 to any desired fundamental frequency. The high voltage end of the inductor 26 is connected directly to the collector 14 of the transistor 8. To complete the oscillator circuit, the emitter 12 of transistor 8 is connected to the source of fixed reference potential or ground for the system.

As shown, the transistor 8 is biased for normal amplifier action, i. e., the emitter 12 is positive with respect to the base 16 while the collector 14 is negative with respect to the base 16. Thus, the collector 14 is referred to as being biased in the relatively non-conducting or reverse direction with respect to the base, while the emitter is referred to as being biased in the relatively conducting or forward direction with respect to the base.

It has been found, in accordance with the present invention, that a high percentage of junction transistors will exhibit a negative resistance characteristic if a fixed bias is applied to their base. This is accomplished if the transistor is connected as shown in Figure 1 of the drawing.

Figure 2:
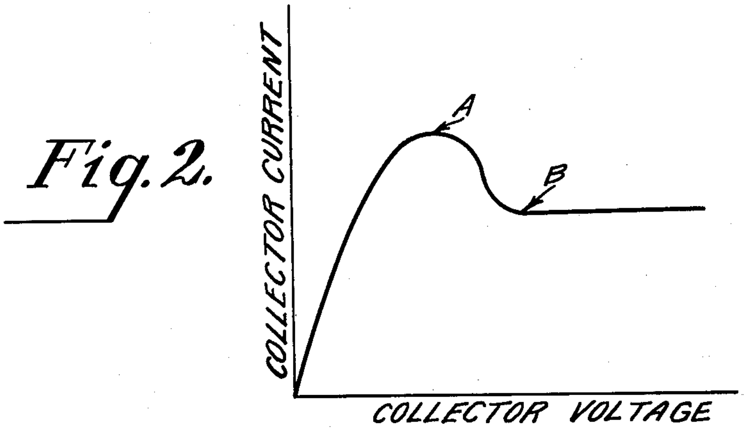
Figure 2 is a graph showing a curve relating collector current to collector voltage of a transistor of the type illustrated in Figure 1.

A typical collector electrode characteristic curve for a P–N–P transistor utilized in an oscillator circuit in accordance with the invention is shown in Figure 2. As the collector voltage increases from zero the collector curent also increases. So long as increases of the collector voltage yield an increase in the collector current, the so-called incremental resistance is positive. At point A, however, the characteristic of the transistor changes. For a typical P–N–P unit, the collector voltage with respect to the emitter is approximately 0.3 volt at this point. After reaching point A, the collector current begins to decrease, even though the collector voltage continues to rise. Thus, in the operating range between point A and point B, which is about 0.5 volt for the typical transistor, an increase in voltage will result in a decrease in collector current. Accordingly, the transistor exhibits negative resistance over this operating range. This negative resistance, which is voltage controlled, has been found to be most pronounced for collector currents exceeding twenty milliamperes and is increased with increasing collector currents.

The negative resistance characteristic exhibited by transistor 8 is used in accordance with the invention to supply the losses of the tuned circuit 30 and sustain oscillations therein. Hence, a junction transistor oscillator connected as described above is possible without the conventional external feedback paths. Oscillations may be taken from any convenient point in the circuit, as from a lead connected with the high voltage end of the tuned circuit 30, or as shown and described in connection with Figure 3.

The oscillator circuit which comprises the present invention may find wide application in electronic communication circuits of all types. Thus, it may find application as a source of fixed frequency oscillations. It is also apparent that this type of oscillator circuit may be used as the local oscillator in a superheterodyne receiver.

Figure 3:
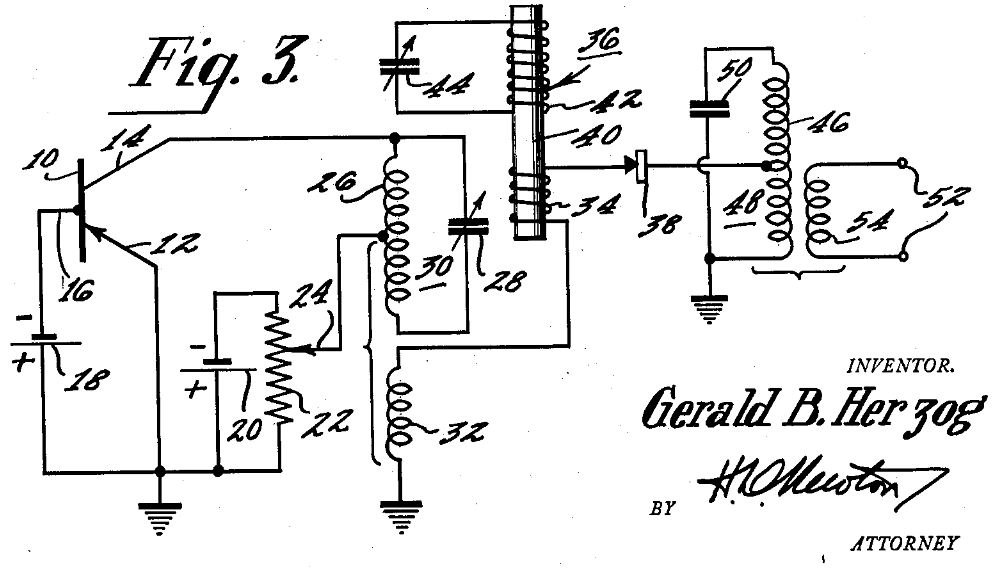
Figure 3 is a schematic circuit diagram of the radio-frequency section of a signal receiver embodying the oscillator of Figure 1 in accordance with the invention.

Thus, for example, in Figure 3 the oscillator signals appearing in the inductor 26 of the oscillator tank circuit 30 may be inductively coupled through the output coil 32, and serially therefrom through a coupling winding 34 of a loop antenna 36 to the anode of a crystal diode 38 acting as the mixer or first detector of the receiver. One terminal of the coupling or output coil 32 is grounded as indicated.

The oscillator circuit may further be identical with that of Figure 1 and is so shown in Figure 3. Therefore, the frequency of the oscillatory energy may be varied by the capacitor 28 in the tank circuit 30.

The loop antenna 36 may comprise a ferromagnetic core or rod 40 which has signal pickup winding 42 mounted thereon in inductively coupled relation to the coupling winding 34. The antenna winding 42 is tuned for response to incoming signals by a variable capacitor 44 connected in shunt relation thereto as shown.

The cathode of the heterodyne crystal mixer 38 is connected to a low impedance matching tap on a tuning inductor 46 of a frequency selective or resonant intermediate frequency output circuit 48. To form a parallel resonant circuit which is resonant at the selected intermediate or beat frequency, the inductor 46 is shunted by a tuning capacitor 50. The output or intermediate frequency signal may be obtained from suitable terminals 52 of an intermediate frequency output inductor 54 inductively coupled to the inductor 46 as shown.

Incoming signals induced in the loop antenna 36 are applied through the winding 42 to the crystal mixer 40 where they are heterodyned with local oscillator signals from the coil 32, to produce beat or intermediate frequency signals which may here be assumed to have a frequency corresponding to both the sum or difference of the signal frequency and the oscillator frequency. The resonant circuit 48 may therefore be tuned to the difference frequency, and conveys the intermediate frequency resultant signal to the output terminals 52 for further amplification as is well known.

As described herein, an improved oscillator circuit in accordance with the invention employs a junction transistor which does not require the provision of an external feedback path. The invention provides a relatively stable circuit which utilizes a minimum of circuit elements, thus achieving simplicity with reliability.

What is claimed is:

1. An oscillator comprising a semi-conductor device having a semi-conductive body, a base electrode, a collector electrode and an emitter electrode in contact therewith, said device being characterized by a current gain of less than unity, means including a source of operating bias voltage for applying a fixed voltage to said base electrode wherein said device exhibits a negative resistance characteristic over a portion of its operating range, and means providing a frequency determining circuit for said oscillator connected with said collector electrode and tunable for response to an alternating current of predetermined frequency.

2. An oscillator as defined in claim 1, wherein said frequency determining circuit means provides a parallel resonant circuit comprising a tuning inductor and shunt tuning capacity means therefor.

3. An oscillator as defined in claim 2 wherein said semiconductive body is of the P–N–P junction type.

4. An oscillator as defined in claim 2 wherein said semiconductive body is of the N–P–N junction type.

5. In an oscillator circuit, the combination with a semiconductor device of the junction type having a semi-conductive body, a base electrode, a collector electrode and an emitter electrode in contact therewith, of means for applying an operating bias voltage between said base electrode and said emitter electrode in a relatively conducting polarity and for applying an operating bias voltage between said base electrode and said collector electrode in a relatively non-conducting polarity, said base bias being fixed wherein said device exhibits a negative resistance characteristic over a portion of its operating range, and a frequency determining circuit connected with said collector electrode and responsive to alternating currents of a predetermined frequency.

6. In a radio receiver, a tunable local oscillator comprising a semi-conductor device having a semi-conductive body, a base electrode, a collector electrode and an emitter electrode in contact therewith, said device being characterized by a current gain of less than unity, energizing means including a source of operating bias connected with said electrodes and operative to apply a fixed bias voltage to said base electrode wherein said device exhibits a negative resistance characteristic for predetermined values of collector voltage, and a variably tunable oscillator output circuit connected with said collector electrode and providing alternating current response in a predetermined frequency range.

7. In an oscillator circuit providing sustained oscillation without external feedback means, the combination comprising a semi-conductor device of the junction type and having a semi-conductive body, a base electrode, a collector electrode and an emitter electrode in contact therewith, means including a source of operating bias potential for applying a fixed bias to said base electrode and a variable bias to said collector electrode, said device having a negative resistance characteristic for predetermined values of collector voltage, and a frequency determining circuit connected between said emitter and collector electrodes and responsive to an alternating current of predetermined frequency therebetween.

8. A tunable oscillator comprising a semi-conductor device of the junction type having a semi-conductive body, an input electrode, an output electrode and a common electrode in contact therewith, energizing means for applying a fixed bias to said input electrode relative to said common electrode and a variable bias to said output electrode relative to said common electrode whereby said device exhibits a negative resistance characteristic, and a parallel resonant circuit connected with said output electrode.

9. In a radio receiver, a tunable source of local oscillator signals comprising a semi-conductor device having a semi-conductive body, an input electrode, an output electrode and a common electrode in contact therewith, said device having a current gain of less than unity, means including a source of operating bias voltage for applying a fixed bias voltage to said input electrode for establishing a negative resistance characteristic of said device over a portion of its operating range, a frequency determining circuit connected with said common and output electrodes providing alternating current flow at a predetermined frequency therebetween, and an output circuit for said oscillator signals coupled with said frequency determining circuit.

10. An oscillator generator comprising a semi-conductor device of the junction type and having a semi-conductive body, a base electrode, a collector electrode and an emitter electrode in contact therewith, means including a source of operating bias voltage for biasing said electrodes to an operating level wherein said device exhibits a negative resistance characteristic, and a parallel resonant circuit connected with said emitter and collector electrodes and tunable to a predetermined oscillator frequency.

11. In an oscillator circuit for providing oscillator signals over a range of frequencies, the combination comprising a semi-conductor device having a semi-conductive body of the junction type and an emitter, a base and a collector electrode cooperatively associated therewith, a source of fixed reference potential, a first source of operating voltage serially connected between said base electrode and said source of reference potential, means connecting said emitter electrode with said source of reference potential, a parallel resonant circuit connected with said collector electrode, and a second source of operating voltage including variable resistance means serially connected between said parallel resonant circuit and said source of reference potential, said operating voltages being effective for biasing said electrodes to an operating level wherein said device exhibits a negative resistance characteristic.

References Cited in the file of this patent

UNITED STATES PATENTS

| | | |
|---|---|---|
| 2,556,286 | Meacham | June 12, 1951 |
| 2,569,347 | Schockley | Sept. 25, 1951 |
| 2,640,919 | Bell et al. | June 2, 1953 |
| 2,647,957 | Mallinckrodt | Aug. 4, 1953 |